(12) United States Patent
Nishitani

(10) Patent No.: US 12,362,128 B2
(45) Date of Patent: Jul. 15, 2025

(54) ELECTRON BEAM APPLICATOR, AND ELECTRON BEAM EMISSION METHOD IN ELECTRON BEAM APPLICATOR

(71) Applicant: Photo electron Soul Inc., Nagoya (JP)

(72) Inventor: Tomohiro Nishitani, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 537 days.

(21) Appl. No.: 17/604,373

(22) PCT Filed: Oct. 13, 2020

(86) PCT No.: PCT/JP2020/038569
§ 371 (c)(1),
(2) Date: Oct. 15, 2021

(87) PCT Pub. No.: WO2021/100359
PCT Pub. Date: May 27, 2021

(65) Prior Publication Data
US 2022/0199350 A1    Jun. 23, 2022

(30) Foreign Application Priority Data

Nov. 20, 2019    (JP) .................................. 2019-209244

(51) Int. Cl.
*H01J 37/073*    (2006.01)
*H01J 3/02*    (2006.01)
(Continued)

(52) U.S. Cl.
CPC ............ *H01J 37/075* (2013.01); *H01J 3/021* (2013.01); *H01J 37/073* (2013.01); *H01J 37/12* (2013.01);
(Continued)

(58) Field of Classification Search
None
See application file for complete search history.

(56) References Cited

U.S. PATENT DOCUMENTS 6,215,128 B1    4/2001    Mankos et al.
8,895,922 B2    11/2014    Berney
(Continued)

FOREIGN PATENT DOCUMENTS

CN    108885961 A    11/2018
EP    0641011 A2    3/1995
(Continued)

OTHER PUBLICATIONS

Korea Office Action issued by KIPO, dated Jul. 31, 2023 for corresponding Korean patent application No. 10-2021-7032425 with English translation (total 11 pages).
(Continued)

*Primary Examiner* — Eliza W Osenbaugh-Stewart
(74) *Attorney, Agent, or Firm* — Intellectual Property Law Group LLP

(57) ABSTRACT

An object is to provide an electron beam applicator suitable for an electron gun having a photocathode and an electron beam emission method in the electron beam applicator. The object can be achieved by an electron beam applicator including: an electron gun section; a main body section; and a control unit. The electron gun section includes a light source, a photocathode that emits an electron beam in response to receiving excitation light emitted from the light source, and an anode. The main body section includes an objective lens that converges an electron beam emitted from the electron gun section. The control unit controls at least convergence power of the objective lens in accordance with a size of an electron beam emitted from the photocathode.

20 Claims, 10 Drawing Sheets

(51) Int. Cl.
*H01J 37/075* (2006.01)
*H01J 37/12* (2006.01)
*H01J 37/28* (2006.01)

(52) U.S. Cl.
CPC ..... *H01J 37/28* (2013.01); *H01J 2237/06308* (2013.01); *H01J 2237/06333* (2013.01)

(56) References Cited

U.S. PATENT DOCUMENTS

| | | | |
|---|---|---|---|
| 9,934,926 | B2 | 4/2018 | Nishitani |
| 11,195,685 | B2* | 12/2021 | Iijima ................ H01J 3/18 |
| 2004/0108812 | A1* | 6/2004 | Janaway ............ H01J 37/073 313/542 |
| 2013/0341527 | A1 | 12/2013 | Berney |
| 2016/0307726 | A1 | 10/2016 | Hatakeyama et al. |
| 2018/0358199 | A1 | 12/2018 | Kumamoto et al. |
| 2020/0080949 | A1 | 3/2020 | Nishitani et al. |
| 2020/0303152 | A1 | 9/2020 | Ohshima et al. |

FOREIGN PATENT DOCUMENTS

| | | |
|---|---|---|
| EP | 0851460 A1 | 7/1998 |
| EP | 3780063 A1 | 2/2021 |
| JP | S 533774 B2 | 1/1978 |
| JP | S 628436 A | 1/1987 |
| JP | S62234849 A | 10/1987 |
| JP | H 02213037 A | 8/1990 |
| JP | H 11273601 A | 10/1999 |
| JP | 2001143648 A | 5/2001 |
| JP | 2002-539633 A | 11/2002 |
| JP | 3537779 B2 | 3/2004 |
| JP | 2014-512069 A | 5/2014 |
| JP | 5808021 B2 | 11/2015 |
| JP | 646020 B1 | 2/2019 |
| JP | 6578529 B1 | 9/2019 |
| JP | 2020064729 A | 4/2020 |
| TW | 201634917 A | 10/2016 |
| TW | 201721701 A | 6/2017 |
| TW | 201933411 A | 8/2019 |
| WO | WO 0055690 A2 | 9/2000 |
| WO | WO2008/086527 | 7/2008 |
| WO | WO 2012126792 A1 | 9/2012 |
| WO | WO 2017/168554 A1 | 10/2017 |
| WO | WO 2019131410 A1 | 7/2019 |

OTHER PUBLICATIONS

Israel Office Action issued by ILPO, dated Aug. 24, 2023 for corresponding Israeli patent application No. 287087 (total 4 pages).
Man-Jin Park et al., "Design and fabrication of scanning electron microscope using a finite element analysis for electron optical system", Journal of Mechanical Science and Technology, 22 (2008), pp. 1734-1746.
Daiki Sato et al., "Observation of relaxation time of surface charge limit for InGaN photocathodes with negative electron affinity", 2016 The Japan Society of Applied Physics, 55 05FH05, (5 pages).
Japan Office Action, dated Dec. 1, 20193 for corresponding Japanese Patent Application No. 2019-209244 with English translation (16 pages).
International Search Report, dated Dec. 8, 2020 for corresponding International Application No. PCT/JP2020/038569 with English translation (6 pages).
Written Opinion of the ISA, dated Dec. 8, 2020 for corresponding International Application No. PCT/JP2020/038569 with English translation (12 pages).
European Extended European Search Report, dated Jun. 23, 2022 for corresponding European application No. 20890776.6 (total 13 pages).
Taiwan Office Action issued by TIPO, dated Jun. 5, 2024 for corresponding Taiwan No. 11320568600 with English translation (15 pages).
Korea Office Action issued by KIPO, dated Feb. 20, 2024 for corresponding Korean patent application No. 10-2021-7032425 with English translation (6 pages).
China Office Action issued by CNIPA, dated Feb. 1, 2024 for corresponding China patent application No. 202080028780.4 with English translation (18 pages).
Second China Office Action issued by CNIPA, dated Oct. 13, 2024 for corresponding China patent application No. 202080028780.4 with English translation (17 pages).
Decision of Refusal issued by CNIPA, dated Jan. 19, 2025 for corresponding China patent application No. 202080028780.4 with English translation (29 pages).

* cited by examiner

ELECTRON BEAM APPLICATOR, AND ELECTRON BEAM EMISSION METHOD IN ELECTRON BEAM APPLICATOR

CROSS-REFERENCE TO RELATED APPLICATIONS

This application is a U.S. National Phase application, under 35 U.S.C. § 371, of International Application no. PCT/JP2020/038569, with an international filing date of Oct. 13, 2020, and claims priority to Japanese application no. 2019-209244, filed on Nov. 20, 2019, each of which is hereby incorporated by reference for all purposes.

TECHNICAL FIELD

The disclosure in the present application relates to an electron beam applicator and an electron beam emission method in the electron beam applicator.

BACKGROUND ART

Electron microscopes or the like having an electron gun are known. As types of the electron gun, a thermionic emission type, a field emission (FE) type, a Schottky type, and the like are known. An electron beam emitted from an electron gun has diverging energy. Since an electron microscope needs to obtain a bright image and a high resolution, various improvements have been made to a process before a sample is irradiated with an electron beam emitted from an electron gun. FIG. 1A is a diagram illustrating an overview of an electron microscope equipped with a thermionic emission type electron gun. In the example illustrated in FIG. 1A, (1) convergence of an electron beam emitted from an electron gun by using a condenser lens, removal of a peripheral part of the electron beam, which may cause aberration, by using an aperture, and the like are repeated, and (2) finally an objective lens is used to irradiate a sample with an electron beam having an improved quality, and detection is performed (see Non-Patent Literature 1).

On the other hand, an electron gun having a photocathode which is a different type from the above and an electron beam applicator having the electron gun are known (see Patent Literature 1). Since the electron gun equipped with a photocathode disclosed in Patent Literature 1 can emit a bright, sharp electron beam by irradiating the photocathode with excitation light, development of electron guns having a photocathode is in progress.

CITATION LIST

Patent Literature

Patent Literature 1: Japanese Patent No. 5808021
Non-Patent Literature 1: Man-Jin Park et al., "Design and fabrication of a scanning electron microscope using a finite element analysis for electron optical system", Journal of Mechanical Science and Technology, 22(2008), pp. 1734-1746

SUMMARY OF THE INVENTION

Technical Problem

Among other types of electron guns, the thermionic emission type electron guns are superior in an amount of probe current, current stability, a price, or the like and are often used in general purpose SEMs, EPMAs, Auger analyzers, or the like. Thus, study examples for control of an electron beam in an electron beam applicator equipped with an electron gun are mostly directed to the control for a case of using a thermionic emission type electron gun, as disclosed in Non-Patent Literature 1.

As described above, since an electron gun equipped with a photocathode can emit a bright, sharp electron beam, development thereof is in progress in recent years. However, electron guns equipped with a photocathode are under development, and in the present circumstances, the development has reached only devices in which an electron gun section of an electron beam applicator is replaced with an electron gun having a photocathode. Therefore, currently, control of an electron beam in an electron beam applicator including an electron gun having a photocathode has not been substantially studied so far.

Intensive studies by the present inventors have newly found that:
(1) from an electron beam emitted from a photocathode, a more parallel electron beam can be obtained compared to electron beams emitted from an electron gun of the thermionic emission type or the like;
(2) the size of an electron beam (diameter of an electron beam) emitted from a photocathode is determined by the size of irradiated excitation light;
(3) thus, an electron beam can be converged only by controlling convergence intensity of an objective lens in accordance with the size of an electron beam emitted from the photocathode; and
(4) as a result, control of an electron beam is facilitated.

Accordingly, an object of the disclosure of the present application relates to an electron beam applicator that is suitable for an electron gun having a photocathode and to an electron beam emission method in the electron beam applicator.

Solution to Problem

The present application relates to an electron beam applicator and an electron beam emission method in the electron beam applicator illustrated below.
(1) An electron beam applicator comprising:
  an electron gun section;
  a main body section; and
  a control unit,
  wherein the electron gun section includes
  a light source,
  a photocathode that emits an electron beam in response to receiving excitation light emitted from the light source, and
  an anode,
  wherein the main body section includes
  an objective lens that converges an electron beam emitted from the electron gun section, and
  wherein the control unit controls at least convergence power of the objective lens in accordance with a size of an electron beam emitted from the photocathode.
(2) The electron beam applicator according to (1) above, wherein the control unit controls intensity of excitation light emitted from the light source.
(3) The electron beam applicator according to (1) or (2) above further comprising an excitation light size control member that controls a size of excitation light emitted from the light source to the photocathode,
  wherein the excitation light size control member is arranged between the light source and the photocathode.

(4) The electron beam applicator according to any one of (1) to (3) above,
wherein the objective lens is an electrostatic lens, and
wherein the control unit controls a value of a voltage applied to the electrostatic lens.

(5) The electron beam applicator according to any one of (1) to (4) above,
wherein an intermediate electrode is arranged between the photocathode and the anode, and
wherein
the intermediate electrode has an electron beam passage hole through which an electron beam emitted from the photocathode passes, and
when an electric field is formed between the photocathode and the anode by application of a voltage, a drift space where influence of the electric field is ignorable is formed in the electron beam passage hole.

(6) The electron beam applicator according to any one of (1) to (5) above, wherein the electron beam emitted from the photocathode has no focal point between the photocathode and the objective lens.

(7) The electron beam applicator according to (5) above, wherein the electron beam emitted from the photocathode has a focal point between the photocathode and the objective lens.

(8) The electron beam applicator according to any one of (1) to (7) above, wherein the electron beam applicator is selected from
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

(9) An electron beam emission method in an electron beam applicator,
wherein the electron beam applicator includes an electron gun section, a main body section, and a control unit,
wherein the electron gun section includes
a light source,
a photocathode that emits an electron beam in response to receiving excitation light emitted from the light source, and
an anode,
wherein the main body section includes
an objective lens that converges an electron beam emitted from the electron gun section,
the emission method comprising:
an electron beam emission step of emitting an electron beam from the photocathode in response to receiving excitation light emitted from a light source;
an electron beam traveling step of causing an electron beam emitted by the electron beam emission step to travel toward the objective lens arranged in the main body section; and
an electron beam convergence step of converging the electron beam, which reached the main body section by the electron beam traveling step, by using the objective lens, and
wherein in the electron beam traveling step, the electron beam emitted from the photocathode travels without having a focal point until reaching the objective lens.

(10) The emission method according to (9) above, wherein in the electron beam convergence step, the control unit controls convergence power of the objective lens for controlling a degree of convergence of the electron beam.

(11) The emission method according to (9) or (10) above further comprising, before the electron beam emission step, an excitation light intensity control step of, at the control unit, controlling intensity of the excitation light emitted from the light source.

(12) The emission method according to any one of (9) to (11) above,
wherein an excitation light size control member that controls a size of excitation light emitted from the light source to the photocathode is arranged between the light source and the photocathode, and
wherein before the electron beam emission step, the control unit performs an electron beam size control step of using the excitation light size control member to control a size of an electron beam emitted from the photocathode.

(13) The emission method according to any one of (9) to (12) above,
wherein an intermediate electrode is arranged between the photocathode and the anode, and
wherein in the electron beam traveling step, the control unit controls the intermediate electrode so that the electron beam emitted from the photocathode
travels so as to have no focal point between the photocathode and the objective lens, or
travels so as to have a focal point between the photocathode and the objective lens.

Advantageous Effect of Invention

According to the disclosure in the present application, control of an electron beam can be simplified in an electron beam applicator including an electron gun having a photocathode.

DESCRIPTION OF THE EMBODIMENTS

Figure 1A:
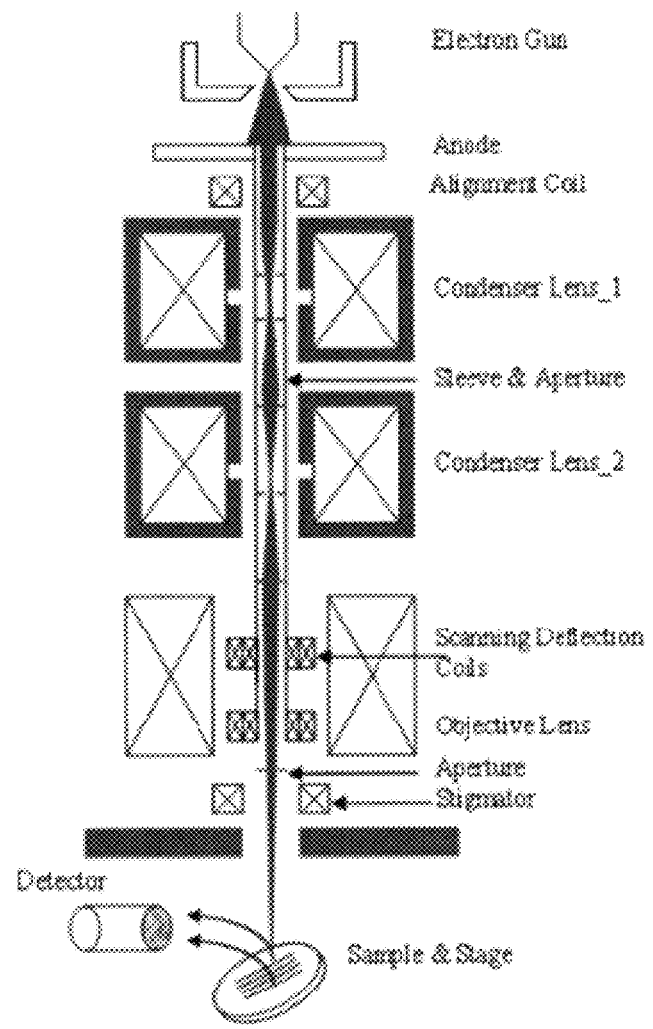
FIG. 1A is a diagram illustrating an overview of an electron microscope equipped with a thermionic emission type electron gun.

An electron beam applicator and an electron beam emission method in the electron beam applicator will be described below in detail with reference to the drawings. Note that, in this specification, members having the same type of functions are labeled with the same or similar references. Further, for members labeled with the same or similar references, the duplicated description thereof may be omitted.

Further, the position, size, range, or the like of each feature illustrated in the drawings do not always represent the actual position, size, range, or the like for easier understanding. Thus, the disclosure in the present application is not necessarily limited to the position, size, range, or the like disclosed in the drawings.

Definition of Directions

In this specification, a direction in which an electron beam emitted from a photocathode travels is defined as a Z direction. Note that, although the Z direction is the perpendicularly downward direction, for example, the Z direction is not limited to the perpendicularly downward direction.

First Embodiments of Electron Beam Applicator 1A

Figure 2:
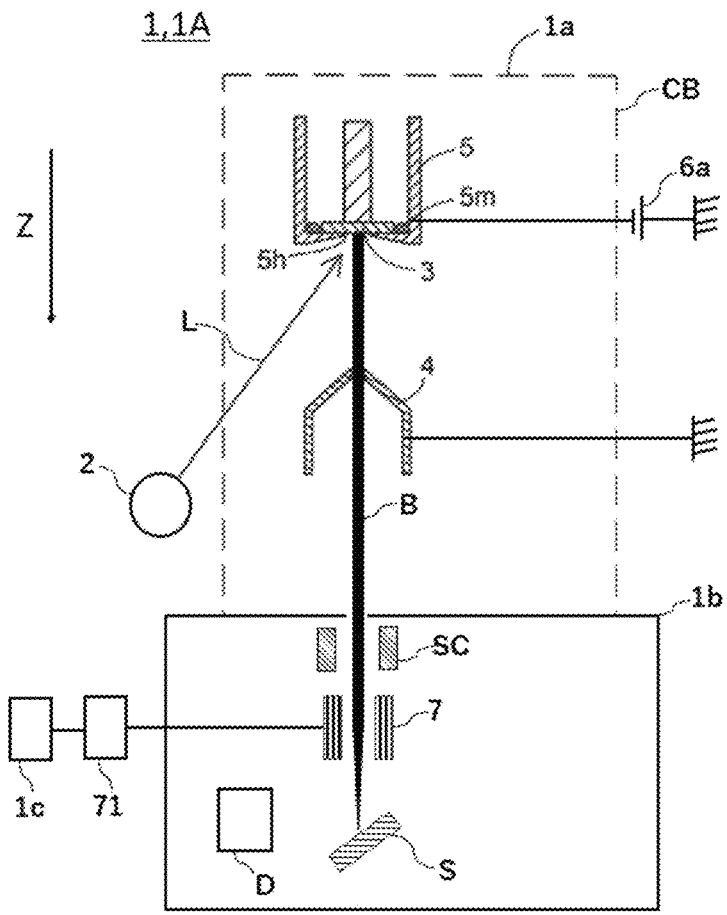
FIG. 2 is a schematic sectional view when a scanning electron microscope (SEM) is employed as an electron beam applicator 1A in a first embodiment.

An electron beam applicator 1A in the first embodiment will be described with reference to FIG. 2. FIG. 2 is a schematic sectional view when a scanning electron microscope (SEM) is employed as the electron beam applicator 1A in the first embodiment.

The electron beam applicator 1A in the first embodiment includes an electron gun section 1a, a main body section 1b, and a control unit 1c.

The electron gun section 1a has at least a light source 2, a photocathode 3, and an anode 4. Optionally, additionally, a photocathode housing container 5 that accommodates the photocathode 3 may be included. Further, optionally, additionally, a first power supply 6a that generates an electric field between the photocathode 3 and the anode 4 may be included.

The main body section 1b includes at least an objective lens 7. Note that, although FIG. 2 illustrates a scanning coil SC, a sample S, and a detector D as an example because the example of a SEM is illustrated as the electron beam applicator 1A, the scanning coil SC, the sample S, and the detector D are not essential features as the electron beam applicator 1A but optional, additional features required for the SEM. When the electron beam applicator 1A is used as a device other than a SEM, features required for the device can be added in addition to the features of the electron beam applicator 1A disclosed in this specification. Note that, in the example of the SEM illustrated in FIG. 2, the scanning coil SC is used for scanning the sample S with an electron beam B emitted from the photocathode 3. Although depiction is omitted, the scanning coil SC is controlled by the control unit 1c.

The light source 2 is not particularly limited as long as it can irradiate the photocathode 3 with excitation light L to cause the electron beam B to be emitted. The light source 2 may be, for example, a high power (watt order) and high frequency (several hundred MHz) ultrashort pulse laser light source, a relatively inexpensive laser diode, an LED, or the like. The emitted excitation light L may be any of pulse light or continuous light and may be controlled as appropriate in accordance with the purpose. Note that, in the example illustrated in FIG. 2, the light source 2 is arranged outside a vacuum chamber CB, and the excitation light L is emitted from the first surface (the surface on the anode 4 side) of the photocathode 3. Alternatively, when a photocathode substrate described later is formed of a transparent material, the light source 2 may be arranged above the vacuum chamber CB, and the excitation light L may be emitted from the backside (the surface opposite to the first surface) of the photocathode 3. Further, the light source 2 may be arranged inside the vacuum chamber CB.

The photocathode 3 emits the electron beam B in response to receiving the excitation light L emitted from the light source 2. More specifically, electrons in the photocathode 3 are excited by the excitation light L, and excited electrons are emitted from the photocathode 3. The emitted electrons form the electron beam B by an electric field formed by the anode 4 and the cathode 3. Note that, with respect to usage of the terms "photocathode" and "cathode" in this specification, the term "photocathode" may be used when emission of an electron beam is meant, and the term "cathode" may be used when a counter electrode of "anode" is meant, however, the reference "3" is used for both the cases of "photocathode" and "cathode".

The photocathode 3 is formed of a substrate of quartz glass, sapphire glass, or the like and a photocathode film (not illustrated) adhered to the first surface (the surface on the anode 4 side) of the substrate. The photocathode material for forming the photocathode film is not particularly limited as long as it can emit an electron beam when irradiated with excitation light and may be made of a material requiring EA surface treatment, a material not requiring EA surface treatment, or the like. The material requiring EA surface treatment may be, for example, a group III-V semiconductor material or a group II-VI semiconductor material. Specifically, AlN, $Ce_2Te$, GaN, a compound of one or more types of alkali metals and Sb, AlAs, GaP, GaAs, GaSb, InAs, or the like, and a mixed crystal thereof, or the like may be used. Another example may be a metal, specifically, Mg, Cu, Nb, $LaB_6$, $SeB_6$, Ag, or the like. With EA surface treatment being performed on the photocathode material, the photocathode 3 can be fabricated, and for the photocathode 3, not only can excitation light be selected in the near-ultraviolet-infrared wavelength region in accordance with gap energy of a semiconductor but also desired electron beam source performance (quantum yield, durability, monochromaticity, time response, spin polarization) in accordance with a use of the electron beam can be obtained through selection of the material or the structure of the semiconductor.

Further, the material not requiring EA surface treatment may be, for example, a single metal, an alloy or a metal compound of Cu, Mg, Sm, Tb, Y, or the like or diamond, WBaO, $Cs_2Te$, or the like. The photocathode not requiring EA surface treatment can be fabricated by a known method (for example, see Japanese Patent No. 3537779). The contents disclosed in Japanese Patent No. 3537779 are incorporated in this specification by reference in their entirety. As described above, the photocathode film is adhered to the first surface of the substrate, and thereby, the photocathode 3 is formed. Therefore, the photocathode 3 does not include a round tip as with a photoelectric cathode. That is, it is excluded that the photocathode 3 has a round tip for emitting electrons.

The anode 4 is not particularly limited as long as it can form an electric field with the cathode 3, and an anode commonly used in the field of electron guns can be used.

The photocathode housing container 5 is provided with an electron beam passage hole 5h through which the electron beam B emitted from the photocathode 3 passes. Further, if necessary, a surface treatment material 5m for performing EA surface treatment (in other words, treatment to reduce electron affinity) on the photocathode 3 may be arranged inside the photocathode housing container 5. The surface treatment material 5m is not particularly limited as long as it is a material that enables EA surface treatment. For example, the surface treatment material 5m may be Li, Na, K, Rb, Cs, Te, Sb, $Cs_2CrO_4$, $Rb_2CrO_4$, $Na_2CrO_4$, $K_2CrO_4$, or the like.

The arrangement of the first power supply 6a is not particularly limited as long as an electric field is formed between the cathode 3 and the anode 4 and the electron beam B emitted from the photocathode 3 by irradiation of the excitation light L can be emitted to the anode 4. In the example illustrated in FIG. 1, the first power supply 6a is arranged so that a potential difference is generated between the cathode 3 and the anode 4, and thereby an electric field can be formed.

The objective lens 7 is used for converging the electron beam B emitted from the photocathode 3. The convergence intensity of the electron beam B by the objective lens 7 is controlled by the control unit 1c described later. Therefore, the electron beam applicator 1A according to the first embodiment can control resolution or contrast by the control unit 1c. The objective lens 7 is not particularly limited as long as it can control the convergence intensity of the electron beam B. For example, an electrostatic lens (electric field lens), a magnetic field lens (electromagnetic lens), the combination thereof, or the like may be used. In a case of the electrostatic lens, it is possible to control the convergence intensity of the electron beam B by controlling an applied voltage. In a case of the magnetic field lens, it is possible to control the convergence intensity of the electron beam B by controlling current. Note that a permanent magnet can also be used as a form of the magnetic field lens, and in such a case, it is possible to control the convergence position of the electron beam B by controlling the acceleration voltage of the electron beam or the physical distance from the anode 4.

To converge the electron beam B into a desired size, it is required to control the convergence power of the objective lens 7 in accordance with the size of the electron beam B when reaching the objective lens 7. The size of the electron beam B emitted from the photocathode 3 is determined by the size of the excitation light L emitted to the photocathode 3. Further, the electron beam B emitted from the photocathode 3 has a much smaller divergence than the electron beam B emitted from the conventional electron gun. In other words, the electron beam B that is less likely to diverge and has directivity is emitted.

Therefore, high reproducibility is obtained for the same conditions if the resolution or the contrast is actually measured in advance when the followings:

(1) the initial emittance of an electron beam at the cathode 3;
(2) the size of the excitation light L;
(3) the voltage, the distance, and the electric field distribution between the cathode 3 and the anode 4;
(4) the distance between the anode 4 and the objective lens 7; and
(5) the convergence power of the objective lens 7 are changed in various ways. The control unit 1c has a memory device, and by storing the actual measurement data in the memory device in advance, it is possible to calculate the convergence power of the objective lens 7 required for having a desired size of the converged electron beam B and control the objective lens 7 based on information on the initial emittance of an electron beam at the cathode 3, the size of the excitation light L, the voltage, the distance, and the electric field distribution between the cathode 3 and the anode 4, the distance between the anode 4 and the objective lens 7, or the like.

Note that the above example illustrates an example of control performed by the control unit 1c, and the control unit 1c may control the objective lens 7 by another method as long as the electron beam B can be converged into a desired size. For example, when at least one of the above (1) to (4) is a fixed value, it may be unnecessary to include data related to the fixed value in the memory device. Further, although the example referencing the actual measurement data has been illustrated in the above example, a correlation equation may be created from the actual measurement data, and the convergence power of the objective lens 7 may be calculated from the correlation equation.

Alternatively, movement of an electron can be simulated under the conditions of (1) to (4). Therefore, simulated data instead of the actual measurement value may be used to calculate the convergence power of the objective lens 7.

Further, the control unit 1c controls a drive source 71 based on the calculated convergence power to control the value of current, the value of voltage, or the like to be applied to the objective lens 7 and control the convergence power of the objective lens 7. As the drive source 71, a general stabilized direct-current power supply can be used. Note that, when a permanent magnet is used as the objective lens 7, the control unit 1c can control an acceleration voltage of the electron beam B or the distance between the sample S and the objective lens 7. More specifically, in the example illustrated in FIG. 2, the control unit 1c can control the electric field intensity between the cathode 3 and the anode 4 by controlling the value of voltage applied from the first power supply 6a to the cathode 3. Further, when the distance between the sample S and the objective lens 7 is controlled, a stage (not illustrated) that can move the sample S and/or the objective lens 7 in the Z-axis direction is provided, and the control unit 1c can control the stage. The control of the stage can be performed by controlling the drive source 71 and controlling current flowing in the motor provided to the stage, for example.

First Embodiment of Electron Beam Emission Method in Electron Beam Applicator

Figure 3:
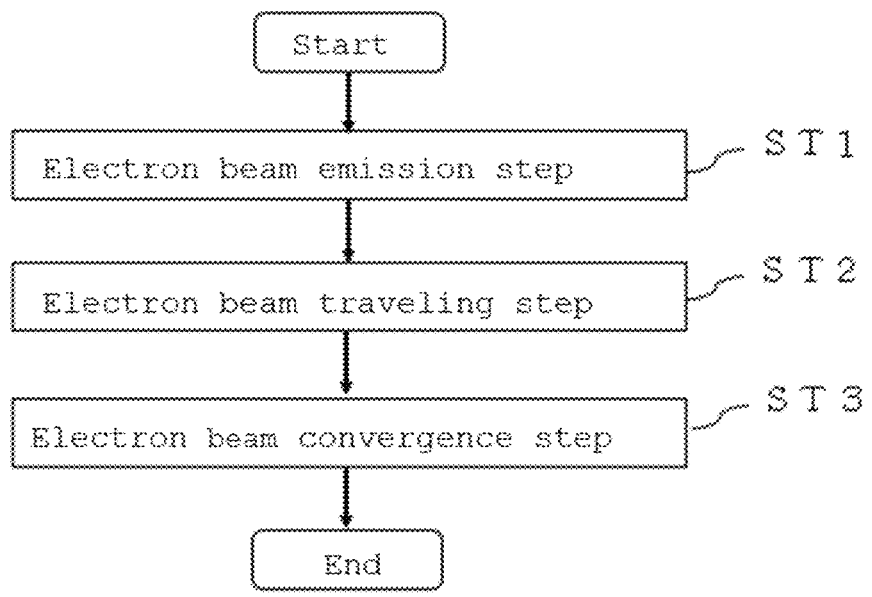
FIG. 3 is a flowchart of the first embodiment of an emission method.

A first embodiment of an electron beam emission method (hereafter, which may be simply referred to as "emission method") in the electron beam applicator will be described with reference to FIG. 2 and FIG. 3. FIG. 3 is a flowchart of the first embodiment of the emission method.

In the first step (ST1), an electron beam emission step is performed. In the electron beam emission step (ST1), as illustrated in FIG. 2, the excitation light L is emitted to the photocathode 3 from the light source 2, and the electron beam B is emitted from the photocathode 3.

In the second step (ST2), an electron beam traveling step is performed. In the electron beam traveling step (ST2), the electron beam B emitted from the photocathode 3 travels toward the objective lens 7 arranged in the main body section due to an electric field formed between the cathode 3 and the anode 4. The emission method according to the first embodiment is featured in that the electron beam B travels without a focal point in the electron beam traveling step (ST2), in other words, before the electron beam B emitted from the photocathode 3 reaches the objective lens 7. Note that "focal point" in this specification means a point at which the beam diameter of the electron beam B is reduced and then increased.

The conventional electron beam applicator is designed under the assumption that the electron beam B emitted from an electron gun is likely to be diverged. More specifically, in the main body section of the electron beam applicator, it is required to repeat narrowing of a reaching electron beam, which is likely to be diverged, by using a condenser lens, removal of a poor quality part of electrons in the peripheral part of the electron beam, and the like and finally control the resolution or the contrast by using an objective lens. On the other hand, the first embodiment does not require the member such as a condenser lens or an aperture that cuts the peripheral part of an electron beam. Therefore, the electron beam B emitted from the photocathode 3 has no focal point in traveling from the photocathode 3 to the objective lens 7. In other words, the electron beam applicator 1A according to the first embodiment can be said to be an electron beam applicator including, in the main body section 1b, no other member than the objective lens that converges an electron beam.

In the third step (ST3), an electron beam convergence step is performed. In the electron beam convergence step (ST3), the electron beam B that has reached the main body section 1b through the electron beam traveling step (ST2) is converged by the objective lens 7. The degree that the electron beam B is converged can be determined by controlling the convergence power of the objective lens 7.

In the conventional electron beam applicator, control of an electron beam for resolution or contrast control is performed by using an electron beam that has reached the main body section because of the following reasons:

(1) that the conventional electron beam applicator is designed under the assumption that an electron beam emitted from an electron gun is diverged;

(2) that, thus, to improve resolution or contrast, a poor-quality part of an electron beam in the peripheral part thereof is cut, and only a good-quality part of the electron beam is converged and used;

(3) that, in determining the degree that the electron beam is converged by a condenser lens, the degree that the electron beam is cut by an aperture, and the degree that the electron beam is converged by an objective lens, it is required to control respective members integrally in association with each other rather than controlling each of the members individually; and (4) that, if control of the size, the intensity, or the like of the electron beam is included in the control described in the above (3), it is required to recalculate the control parameters described in the above (3) in accordance with conditions of the electron beam, and this results in too complex control.

On the other hand, the electron beam applicator 1A according to the first embodiment and the electron beam emission method using the electron beam applicator 1A require neither the condenser lens nor the aperture accompanied thereby. Therefore, a plurality of advantageous effects below can be achieved at the same time.

(a) The main body section of the electron beam applicator 1A can be reduced in size.

(b) Since the electron beam B emitted from the photocathode 3 is a better-quality electron beam than conventional one, it is not required to cut the electron beam in the peripheral part thereof. Therefore, since the electron beam emitted from the photocathode 3 can be directly used, small energy divergence and large current can be utilized. Therefore, in the electron beam applicator 1A of the first embodiment, an image can be obtained with a high resolution, a high scanning speed, or the like.

(c) Since the electron beam B emitted from the photocathode 3 is a better-quality electron beam than conventional one, it is not required to cut the electron beam in the peripheral part thereof. Therefore, the electron beam emitted from the photocathode 3 can be used in its entirety, and energy can thus be saved.

(d) Since the control target of the main body section 1b controlled by the control unit 1c is only the convergence power of the objective lens 7, the control mechanism is simple. Thus, for example, even when the size of the excitation light L is controlled manually or the like, with such information being input to the control unit 1c, the convergence power of the objective lens 7 can be easily controlled.

(e) The intensity (electron amount) of the electron beam B emitted from the photocathode 3 depends on the intensity of the excitation light L, and the size (diameter) of the electron beam B depends on the size (diameter) of the excitation light L. Further, for the same size of the electron beam B, if the convergence power of the objective lens 7 is the same even when the intensity of the electron beam B is changed, there is no change in the convergence degree of the electron beam B. Therefore, in the electron beam applicator 1A of the first embodiment, for example, if it is determined by using a monitor or the like that it is required to control the resolution, the brightness, or the like, there is no change in the convergence degree of the electron beam B even with a manual operation of the intensity of the light source 2. Therefore, controllability of the resolution or the brightness is improved without a change of the convergence degree (focal point size) of the electron beam B during an operation of the electron beam applicator 1A.

Figure 4:
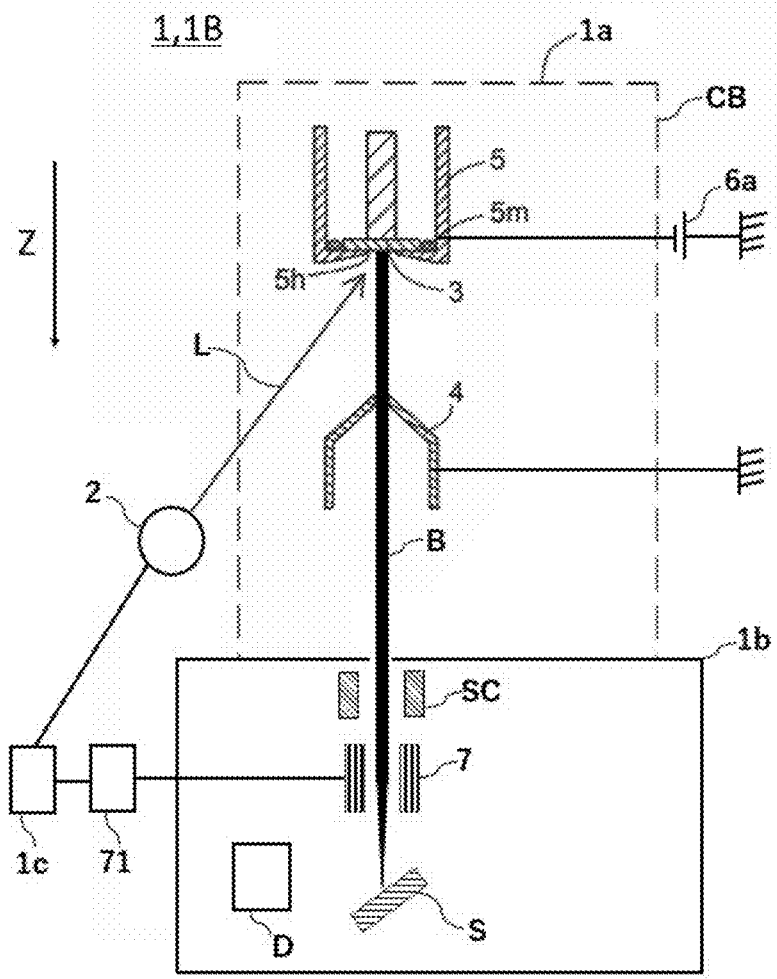
FIG. 4 is a schematic sectional view of an electron beam applicator 1B according to a second embodiment.

Second Embodiment of Electron Beam Applicator 1 and Second Embodiment of Emission Method A second embodiment of the electron beam applicator 1 and the emission method will be described with reference to FIG. 4. FIG. 4 is a schematic sectional view of an electron beam applicator 1B according to the second embodiment. The electron beam applicator 1B is the same as the electron beam applicator 1A according to the first embodiment except that the control unit 1c controls the light source 2 in addition to controlling the convergence power of the objective lens 7. Therefore, in the second embodiment, control performed by the control unit 1c will be mainly described, and duplicated description for the features already described in the first embodiment will be omitted.

In the electron beam applicator 1A according to the first embodiment, the intensity of the light source 2 is controlled manually. On the other hand, in the second embodiment, the control unit 1c controls the intensity of the excitation light L by controlling the light source 2 in addition to the convergence power of the objective lens 7. With the use of the electron beam applicator 1B according to the second embodiment, an advantageous effect that the intensity control of the excitation light L can be automated is achieved, for example.

In the emission method using the electron beam applicator 1B according to the second embodiment, the control unit 1c can perform an excitation light intensity control step of controlling the intensity of the excitation light L emitted from the light source 2 before the electron beam emission step (ST1) when an intensity change of the electron beam B is necessary.

Figure 5:
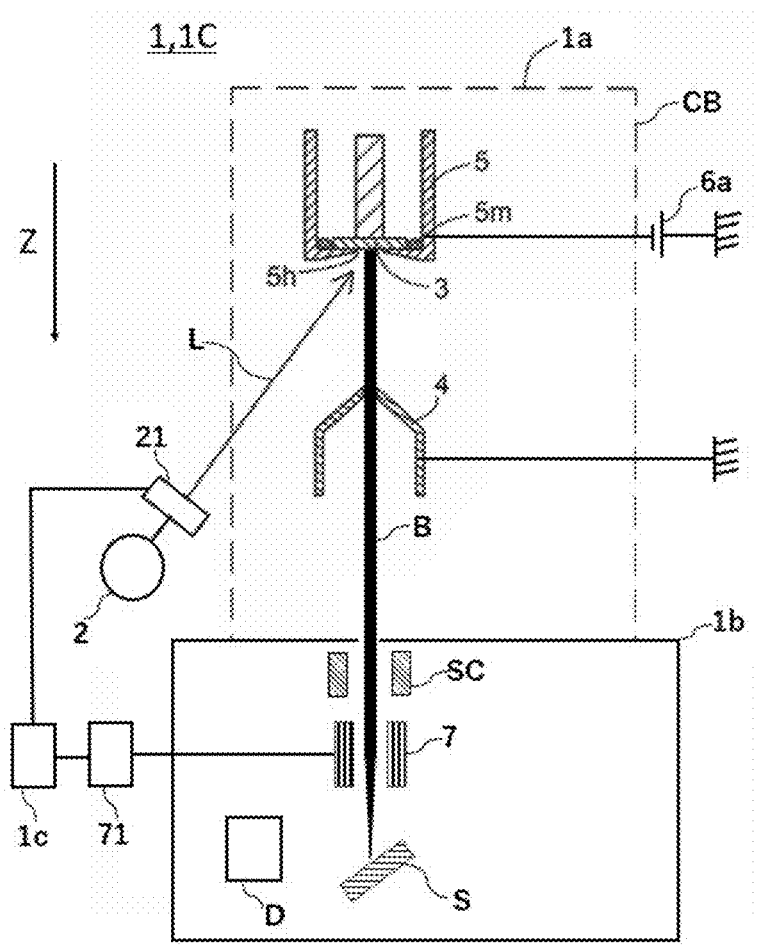
FIG. 5 is a schematic sectional view of an electron beam applicator 1C according to a third embodiment.

Third Embodiment of Electron Beam Applicator 1 and Third Embodiment of Emission Method A third embodiment of the electron beam applicator 1 and the emission method will be described with reference to FIG. 5. FIG. 5 is a schematic sectional view of an electron beam applicator 1C according to the third embodiment. The electron beam applicator 1C is the same as the electron beam applicator 1A according to the first embodiment except that an excitation light size control member 21 that is arranged between the light source 2 and the photocathode 3 and controls the size of the excitation light L emitted from the light source 2 to the photocathode 3 is further provided, and the control unit 1c controls the excitation light size control member 21 in addition to controlling the convergence power of the objective lens 7. Therefore, in the third embodiment, the excitation light size control member 21 and control performed by the control unit 1c will be mainly described, and duplicated description for the features already described in the first embodiment will be omitted.

The excitation light size control member 21 is not particularly limited as long as it can change the size of the excitation light L emitted from the light source 2 to irradiate the photocathode 3. For example, an optical lens, an iris diaphragm, or the like may be used.

In the electron beam applicator 1C, the user may intend to fix the convergence power of the objective lens 7 and control the diameter of the electron beam B when adjusting the electron beam size (probe size) on the surface of the sample S or the like, for example. Further, in adjustment of the electron beam size (probe size) on the surface of the sample S, the user may intend to control both the convergence power of the objective lens 7 and the diameter of the electron beam B when adjusting the electron beam size beyond the range adjusted by the diameter of the electron beam B or the like. The electron beam applicator 1C according to the third embodiment achieves an advantageous effect that both the convergence power of the objective lens 7 and the diameter of the electron beam B emitted from the photocathode 3 can be controlled in association with each other in addition to the advantageous effects achieved by the electron beam applicator 1A according to the first embodiment.

In the emission method using the electron beam applicator 1C according to the third embodiment, the control unit 1c can perform an electron beam size control step of using the excitation light size control member 21 to control the size of the electron beam B emitted from the photocathode 3 before the electron beam emission step (ST1) when a change of the size of the electron beam B is required.

Figure 6:
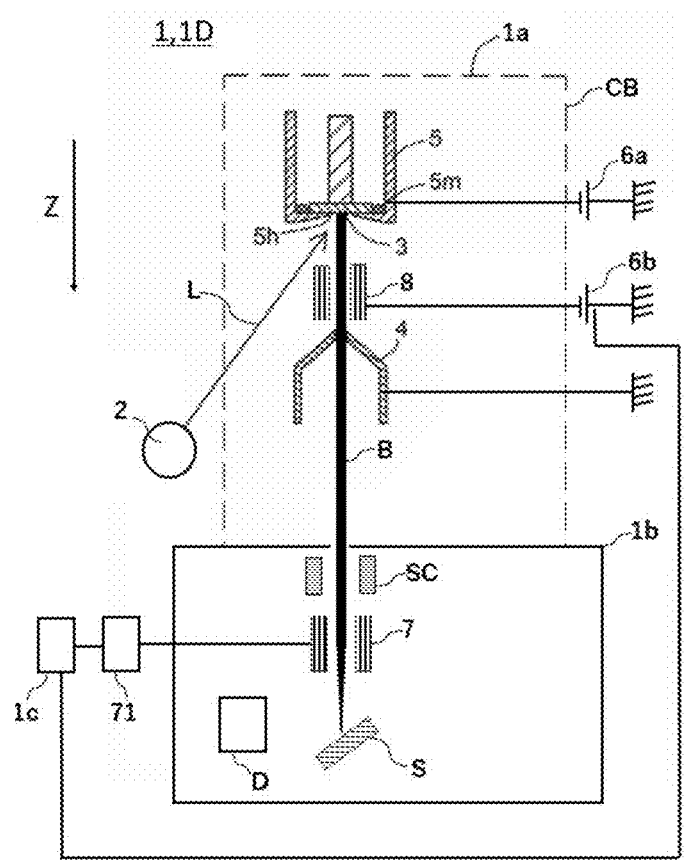
FIG. 6 is a schematic sectional view of an electron beam applicator 1D according to a fourth embodiment.

Fourth Embodiment of Electron Beam Applicator 1 and Fourth Embodiment of Emission Method A fourth embodiment of the electron beam applicator 1 and the emission method will be described with reference to FIG. 6 to FIG. 9. FIG. 6 is a schematic sectional view of an electron beam applicator 1D according to the fourth embodiment. The electron beam applicator 1D is the same as the electron beam applicator 1A according to the first embodiment except that an intermediate electrode 8 is arranged between the photocathode 3 and the anode 4, and a second power supply 6b is optionally, additionally arranged. Therefore, in the fourth embodiment, the intermediate electrode 8 and control performed by the control unit 1c will be mainly described, and duplicated description for the features already described in the first embodiment will be omitted.

The intermediate electrode 8 is used for adjusting the beam diameter of the electron beam B when the electron beam B emitted from the photocathode 3 reaches the objective lens 7.

Overview of Intermediate Electrode 8

First, the overview of the intermediate electrode 8 will be described with reference to FIG. 7. FIG. 7A is a schematic sectional view of the cathode 3, the intermediate electrode 8, and the anode 4, FIG. 7B is a sectional view taken along a line X-X' of FIG. 7A, and FIG. 7C is a sectional view taken along a line Y-Y' of FIG. 7A. In the example illustrated in FIG. 7, the intermediate electrode 8 is formed of a hollow cylinder. An electron beam passage hole 81 through which an electron beam emitted from the photocathode 3 passes is formed in the intermediate electrode 8, an electron beam input port 82 is formed on the photocathode 3 side in the electron beam passage hole 81, and an electron beam exit port 83 is formed on the anode 4 side in the electron beam passage hole 81. The first power supply 6a and the second power supply 6b are used to apply a voltage to generate a potential difference between the cathode 3 and the anode 4 and also apply a voltage to the intermediate electrode 8, and thereby, an electric field EF is generated between the cathode 3 and the intermediate electrode 8 and between the intermediate electrode 8 and the anode 4, as illustrated in FIG. 7A.

The range that the generated electric field EF strongly affects the movement of an electron beam in a gap is inside a sphere including a circle as the maximum cross section when the opening of the gap is the circle. In other words, when the diameter of the electron beam input port 82 illustrated in FIG. 7B is defined as "a", the inside of a sphere having the center at the center of the electron beam input port 82 of the electron beam passage hole 81 and having a radius of a/2 will be strongly affected by the generated electric field EF. Similarly, when the diameter of the electron beam exit port 83 illustrated in FIG. 7C is defined as "b", the inside of a sphere having the center at the center of the electron beam exit port 83 of the electron beam passage hole 81 and having a radius of b/2 will be affected by the generated electric field EF. Therefore, when the length in the center axis direction of the electron beam passage hole 81 is defined as D, if $D/(a/2+b/2)$ is larger than 1, a drift space 84 not affected by the electric field EF is formed inside the electron beam passage hole 81.

As described above, if $D/(a/2+b/2)$ is larger than 1, the drift space 84 is formed. Although $D/(a/2+b/2)$ is not particularly limited as long as it is larger than 1, the drift space 84 is preferably has a certain length, for example, 1.5 or longer, 2 or longer, 3 or longer, 4 or longer, 5 or longer, or the like, which can be suitably set. On the other hand, as long as the electron beam emitted from the photocathode 3 is within a range that can pass through the electron beam passage hole 81, there is no particular upper limit for $D/(a/2+b/2)$. However, if $D/(a/2+b/2)$ is larger, in other words, if the length D of the electron beam passage hole 81 is excessively longer, there is a problem of an increase in size of the electron gun section 1a. Therefore, $D/(a/2+b/2)$ is preferably 1000 or less in terms of device design, and can be suitably set to 500 or less, 100 or less, 50 or less, or the like, if necessary.

Figure 7:
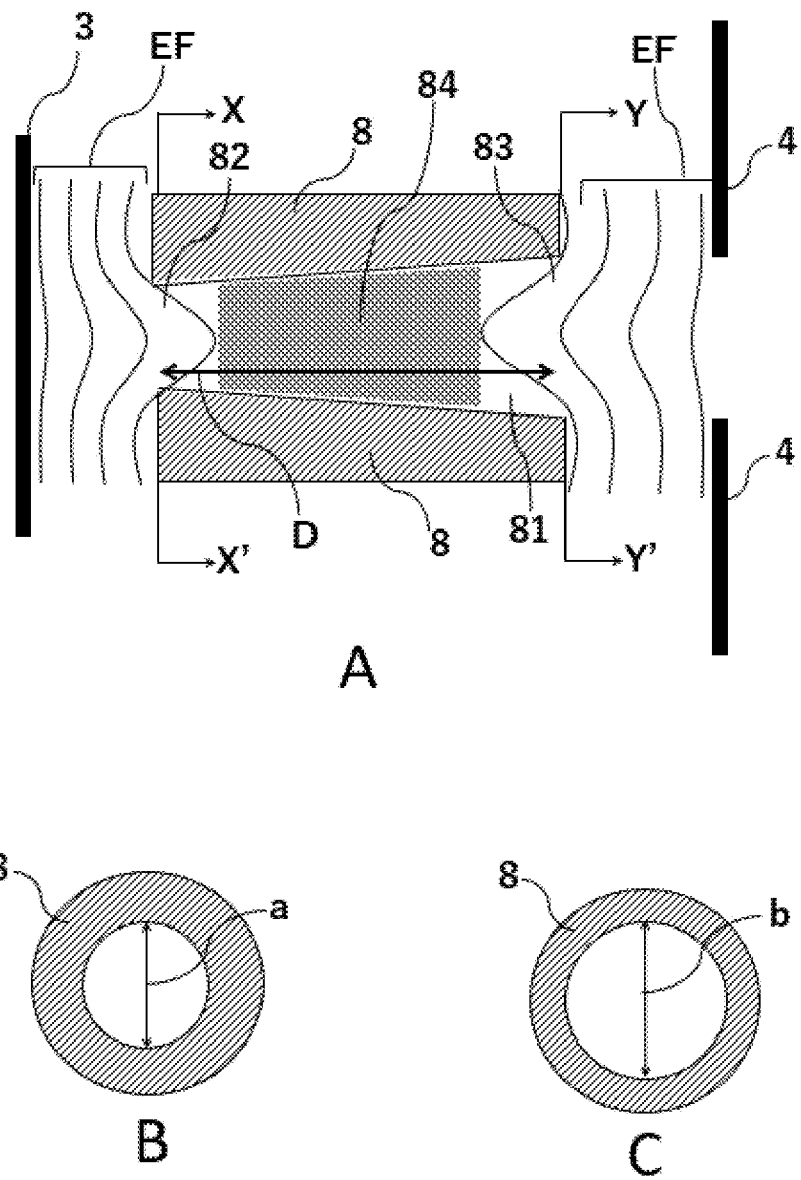
FIG. 7A is a schematic sectional view of a cathode 3, an intermediate electrode 8, and an anode 4.
FIG. 7B is a sectional view taken along a line X-X' of FIG. 7A.
FIG. 7C is a sectional view taken along a line Y-Y' of FIG. 7A.

Note that, although the intermediate electrode 8 has a hollow cylindrical shape and the electron beam passage hole 81 is cone-shaped in the example illustrated in FIG. 7, the shape of the intermediate electrode 8 is not particularly limited as long as it has the electron beam passage hole 81 and the drift space 84 is formed therein. For example, the cross section of the electron beam passage hole 81 may be polygonal, and in such a case, the "a" and "b" can be the diameters of the circumscribed circles of the polygon. In such a case, a line connecting the centers of the circumscribed circles can be defined as the "center axis direction". Further, when the cross section of the electron beam passage hole 81 is elliptical, the "a" and "b" can be the longer axes of the ellipse. In such a case, a line connecting the middle points of the longer axes can be defined as the "center axis direction". Further, although the electron beam input port 82 is smaller than the exit port 83, in other words, a relationship of a<b is met in the example illustrated in FIG. 7, the "a" and "b" may have a relationship of a=b or a>b. Further, although the line connecting the electron beam input port 82 and exit port 83 is a straight line in sectional view in the example illustrated in FIG. 7A, the line may be a non-straight line in sectional view. For example, the length of the cross section in the center part of the electron beam passage hole 81 (cross section of a portion forming a drift space) may be longer than "a" and "b" to have substantially a barrel-shaped electron beam passage hole 81. Note that, while the beam diameter of an electron beam increases inside the drift space 84, it is preferable that the electron beam having the increased beam diameter do not collide with the wall surface of the electron beam passage hole. Thus, the size of the cross section of the electron beam passage hole 81 can be suitably determined by calculating the degree to increase the beam diameter of an electron beam based on the adjustment range of the focal point.

While the intermediate electrode 8 can be arranged anywhere between the cathode 3 and the anode 4, if the arrangement position of the intermediate electrode 8 is excessively close to the cathode 3 or the anode 4, in other words, exceeds the discharge limit, no electron beam will travel. Therefore, the intermediate electrode 8 can be arranged so that the distance between the cathode 3 and the anode 4 does not exceeds the discharge limit.

Further, although the intermediate electrode 8 is formed as a single member in the example illustrated in FIG. 7, a divided structure of a plurality of combined members may be employed as long as the electric field EF formed between the cathode 3 and the anode 4 does not enter the electron beam passage hole 81 from a part other than the electron beam input port 82 and exit port 83.

Figure 8:
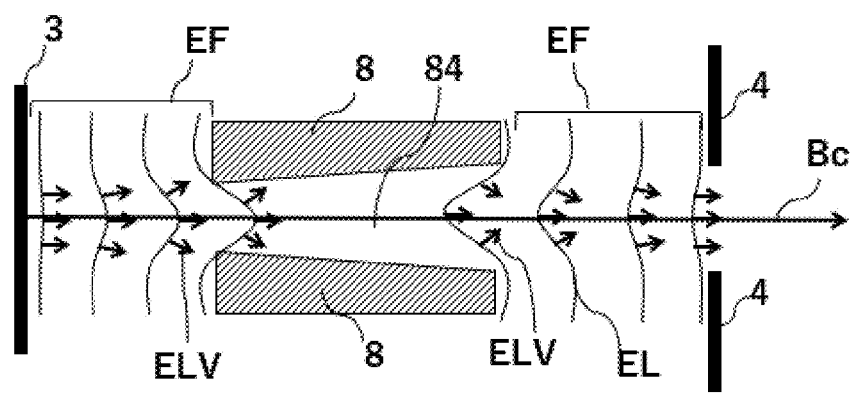
FIG. 8 is a schematic diagram illustrating movement of an electron subjected to influence of an electric field generated between the cathode 3, the intermediate electrode 8, and the anode 4.
Figure 9:
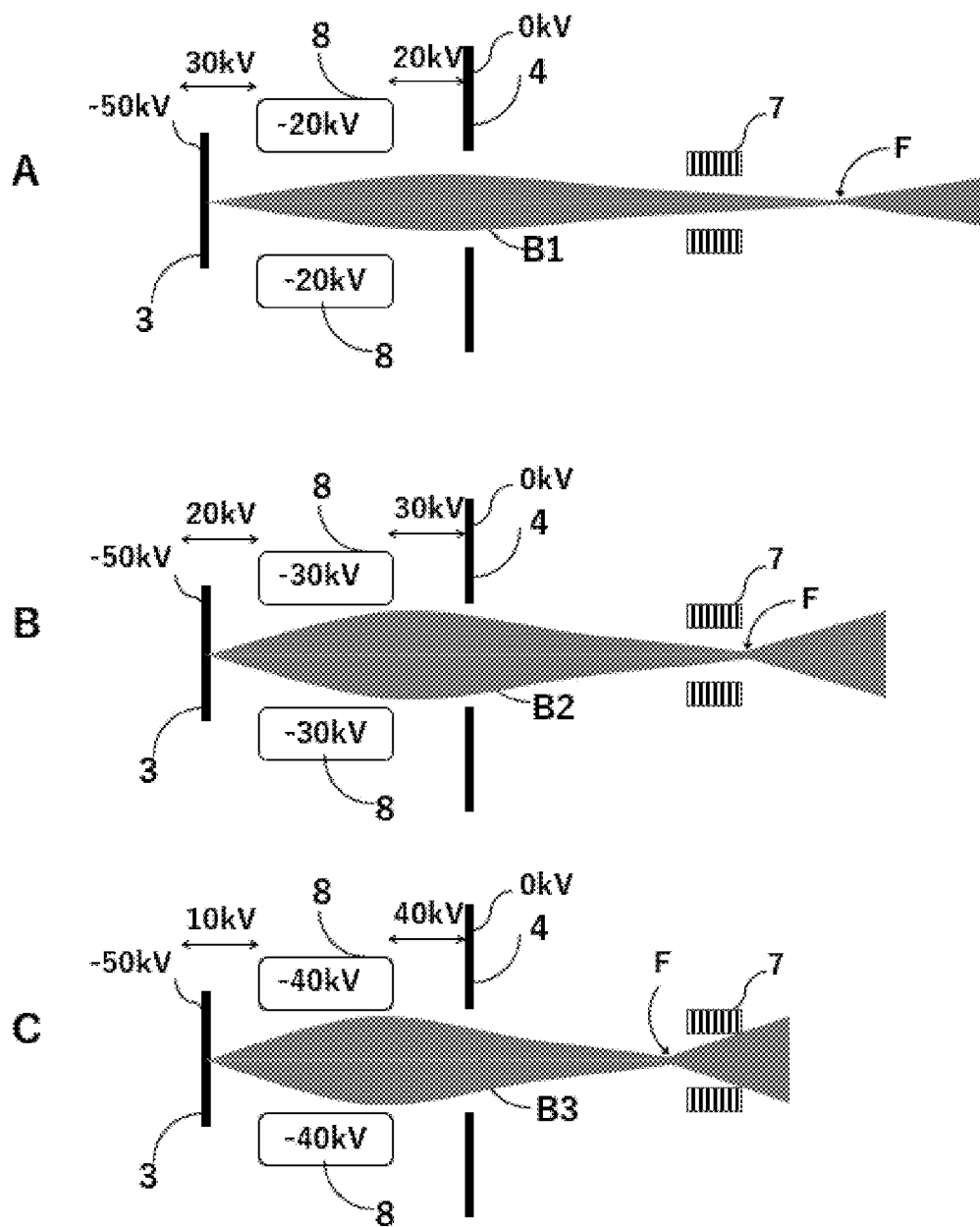
FIG. 9 represents schematic diagrams illustrating a technical significance of the intermediate electrode 8 in the electron beam applicator 1D according to the fourth embodiment.

Next, movement of an electron (electron beam) when the intermediate electrode 8 having the drift space 84 is provided between the cathode 3 and the anode 4 will be described with reference to FIG. 8 and FIG. 9. FIG. 8 is a schematic diagram illustrating the movement of an electron subjected to influence of an electric field generated between the cathode 3, the intermediate electrode 8, and the anode 4. FIG. 9A is a schematic sectional view illustrating movement when a first electron beam B1 travels to the objective lens 7 when the electron beam is emitted in the first condition, and FIG. 9B is a schematic sectional view illustrating movement when a second electron beam B2 travels to the objective lens 7 when the electron beam is emitted in the second condition.

It is known that, when passing through an electric field (EF), an electron beam (electron) is subjected to force from the electric field based on the following principle.

Principle 1: An outer part of an electron beam with respect to the center axis thereof is subjected to stronger force.

Principle 2: An electron beam crossing more equipotential lines per unit length is subjected to stronger force.

Principle 3: An electron beam having larger energy in the traveling direction when crossing an equipotential line is subjected to smaller force in the orthogonal direction (orthogonal to the traveling direction).

More specifically, as illustrated in FIG. 8, the electric field EF is generated between the cathode 3 and the intermediate electrode 8 and between the intermediate electrode 8 and the anode 4 due to potential differences. At this time, equipotential lines EL are formed in the electric field EF, and a normal direction force ELV is generated to each equipotential line EL. That is, an electron beam (electron) is subjected to influence of the normal direction force ELV. Therefore, as illustrated in FIG. 8, although electrons at the center of the electron beam B (arrow Bc in FIG. 8) are subjected to only the force in the straight traveling direction, electrons in the peripheral part of the electron beam B (not illustrated) are subjected to force diverging outward.

Next, the technical significance of the intermediate electrode 8 in the electron beam applicator 1D according to the fourth embodiment will be described with reference to FIG. 9A to FIG. 9C. Note that FIG. 9A to FIG. 9C illustrate the electron beam B in a state where the function of the objective lens 7 is disabled. Further, the values of voltages illustrated in FIG. 9A to FIG. 9C are mere examples for easier understanding and may be different from the values of voltages actually applied to the intermediate electrode 8.

First, in the example illustrated in FIG. 9A and FIG. 9B, the voltage applied to the intermediate electrode 8 is changed as a method for changing the electric fields between the cathode 3 and the intermediate electrode 8 and between the intermediate electrode 8 and the anode 4 from the first condition to the second condition. In the example illustrated in FIG. 9A and FIG. 9B, the difference between the voltage applied to the cathode 3 (−50 kV) and the voltage applied to the anode 4 (0 kV) is constant, and the value of the voltage applied to the intermediate electrode 8 is changed between the first condition (FIG. 9A, −20 kV) and the second condition (FIG. 9B, −30 kV). The voltage difference between the cathode 3 and the intermediate electrode 8 is 30 kV in FIG. 9A and 20 kV in FIG. 9B. That is, when the voltage applied to the intermediate electrode 8 is a value closer to the voltage of the cathode 3, the potential difference between the cathode 3 and the intermediate electrode 8 is smaller. Further, the smaller the potential difference is, the smaller the density of equipotential lines between the cathode 3 and the intermediate electrode 8 is, and therefore, for an electron beam emitted from the photocathode 3, the second electron beam B2 illustrated in FIG. 9B is more likely to diverge than the first electron beam B1 illustrated in FIG. 9A. Furthermore, since a drift space is formed in the intermediate electrode 8, the first electron beam B1 and the second electron beam B2 that are likely to diverge further diverge in the drift space.

On the other hand, since the potential difference between the cathode 3 and the anode 4 is constant, the potential difference between the intermediate electrode 8 and the anode 4 will change opposite to the potential difference between the cathode 3 and the intermediate electrode 8. That is, since the potential difference between the intermediate electrode 8 and the anode 4 is larger in FIG. 9B than in FIG. 9A, the density of equipotential lines between the intermediate electrode 8 and the anode 4 is also larger in FIG. 9B than in FIG. 9A. Furthermore, since the beam diameter of the electron beam after exiting the drift space is larger in FIG. 9B than in FIG. 9A, for an electron beam that has exited the intermediate electrode 8, the second electron beam B2 illustrated in FIG. 9B is more likely to be converged than the first electron beam B1 of FIG. 9A. That is, when the potential difference between the intermediate electrode 8 and the anode 4 is larger, the focal point F can be moved to the short focal point side. Therefore, by using the intermediate electrode 8 to adjust the position of the focal point F of the electron beam B, it is possible to adjust the beam diameter of the electron beam B obtained when the electron beam B reaches the objective lens 7. In the example illustrated in FIG. 9A and FIG. 9B, also when the intermediate electrode 8 is used, the electron beam B has no focal point between the photocathode 3 and the objective lens 7 in the same manner as in the first embodiment.

On the other hand, FIG. 9C illustrates an example in which the minus value of the voltage applied to the intermediate electrode 8 is further increased (−40 kV) from the example illustrated in FIG. 9B and, thereby, an electron beam B3 has a focal point F between the photocathode 3 and the objective lens 7. In the example illustrated in FIG. 9C, by controlling the position of the focal point F between the photocathode 3 and the objective lens 7, it is possible to control the beam diameter obtained when the electron beam B3 diverging from the focal point F reaches the objective lens 7. As illustrated in FIG. 9C, when the electron beam applicator 1D has the intermediate electrode 8, the focal point F can also be positioned between the photocathode 3 and the objective lens 7 by using the function of the intermediate electrode 8 in addition to the example illustrated in FIG. 9A and FIG. 9B. Note that the number of focal points between the photocathode 3 and the objective lens 7 resulted from the presence of the intermediate electrode 8 is one.

The control unit 1c of the electron beam applicator 1D according to the fourth embodiment can control the position of the focal point F by controlling the value of the voltage applied to the intermediate electrode 8 from the second power supply 6b in addition to controlling the convergence power of the objective lens 7.

In the emission method using the electron beam applicator 1D according to the fourth embodiment, when a change of the beam diameter when the electron beam B reaches the objective lens 7 is required, an electron beam focal point position control step of controlling the position of the focal point F of the electron beam B by controlling the value of the voltage applied to the intermediate electrode 8 can be performed before the electron beam emission step (ST1).

The electron beam applicator 1D according to the fourth embodiment achieves the following advantageous effects with the intermediate electrode 8 being provided in addition to the advantageous effects achieved by the electron beam applicator 1A according to the first embodiment.

(1) The electron beam B emitted from the photocathode 3 travels relatively straight but has a slight divergence. However, it is possible to control the size of the electron beam B when entering the objective lens 7 by using the intermediate electrode 8 to control the position of the focal point.

(2) To increase the parallelism of the electron beam B emitted from the photocathode 3, it may be considered useful to enhance the electric field by reducing the distance between the photocathode 3 and the anode 4. However, if the distance between the photocathode 3 and the anode 4 is reduced to enhance the electric field, this causes a problem of easier discharge due to the enhanced electric field between members inside the electron gun. On the other hand, with the use of the intermediate electrode 8, it is possible to control the size of the electron beam when reaching the objective lens 7, and it is therefore possible to cause the electron beam of a desired size to reach the objective lens 7 while maintaining an electric field intensity in a range that does not cause discharge.

Note that each of the first to fourth embodiments described above illustrates an example of the electron beam applicator 1 and the electron beam emission method in the electron beam applicator disclosed in the present application, and various design changes may be possible. For example, any embodiments selected from the first to fourth embodiments may be combined with each other.

Figure 1B:
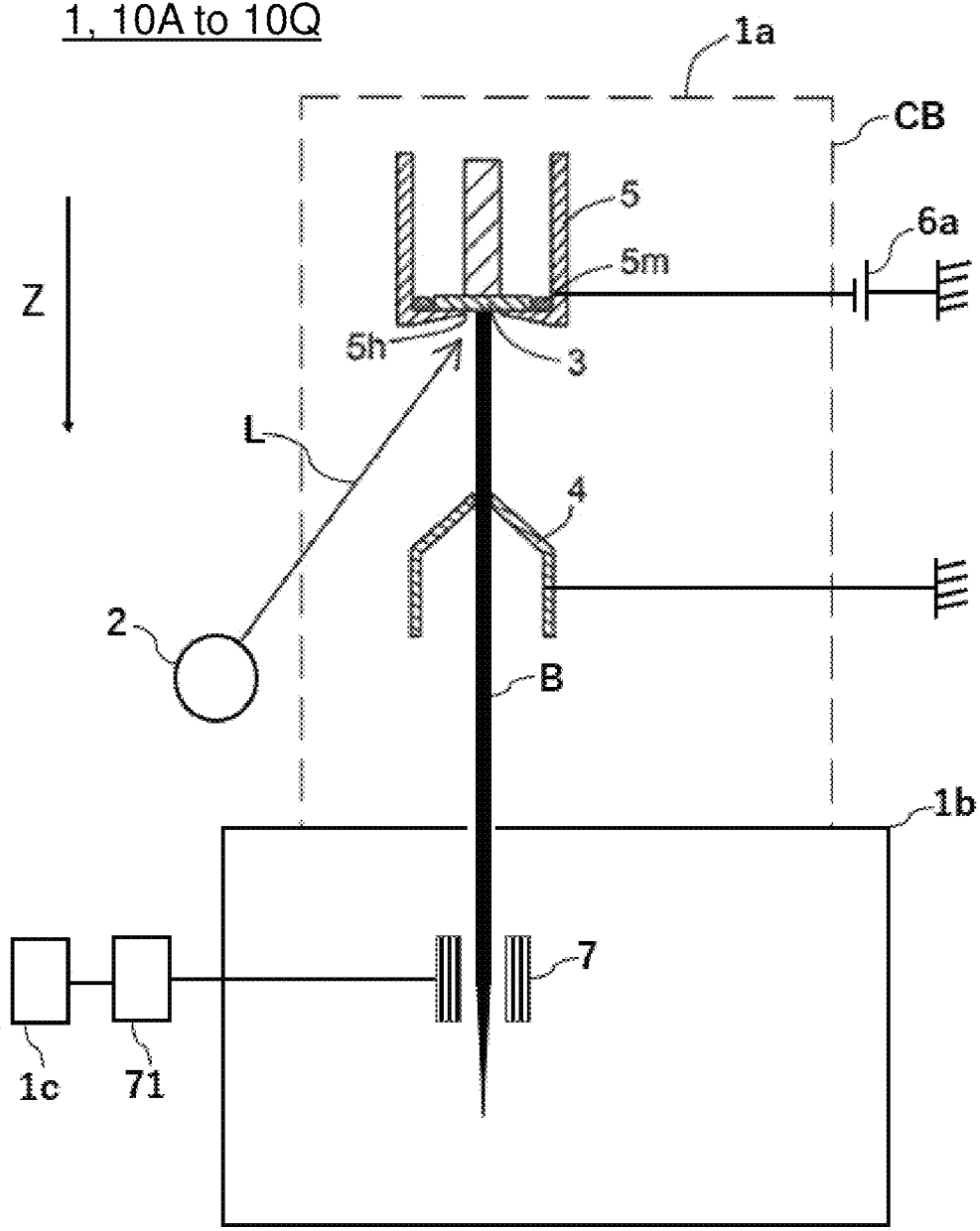
FIG. 1B is a schematic sectional view when any one of alternative devices equipped with an electron gun is employed as an electron beam applicator 10A-10Q according to embodiments of the present invention.

The electron beam applicator 10A to 10Q may be a known device equipped with an electron gun (See FIG. 1B). For example, the electron beam applicator 10A to 10Q may be a free electron laser accelerator 10A, an electron microscope 10B, an electron holography device 10C, an electron beam drawing device 10D, an electron diffractometer 10E, an electron beam inspection device 10F, an electron beam metal additive manufacturing device 10G, an electron beam lithography device 10H, an electron beam processing device 10I, an electron beam curing device 10J, an electron beam sterilization device 10K, an electron beam disinfection device 10L, a plasma generation device 10M, an atomic element generation device 10N, a spin-polarized electron beam generation device 10O, a cathodoluminescence device 10P, an inverse photoemission spectroscopy device 10Q, or the like.

Although an example will be presented below to specifically describe the embodiments disclosed in the present application, this example is to merely describe the embodiment. The example neither limits the scope of the invention disclosed in the present application nor expresses restriction.

EXAMPLE

Example 1

Fabrication of Electron Gun Section

A laser light source (iBeamSmart by Toptica) was used for the light source 2. For the photocathode 3, an InGaN photocathode was fabricated by a known method disclosed in Daiki SATO et al. 2016 Jpn. J. Appl. Phys. 55 05FH05. NEA treatment of the photocathode surface was performed by a known method.

Fabrication of Electron Beam Applicator (SEM)

The electron gun section of a commercially available SEM was replaced with the fabricated electron gun section. Note that the specification of the commercially available SEM was that a cold-type electric field emission electron source (CFE) is used for the electron gun, the maximum acceleration voltage of an electron beam is 30 kV, and observation at a maximum of 800,000 times is possible. Further, the SEM is designed such that an electron beam reaching the main body section is controlled by using a plurality of condenser lenses or the like and, thereby, the electron beam with a desired size enters the objective lens. In Example 1, the SEM was fabricated with improvement so that the condenser lens of the commercially available SEM does not function, in other words, with improvement so that an electron beam entering the main body section is converged by using only the objective lens.

Comparative Example 1

A SEM in which the electron gun section of a commercially available SEM was merely replaced with the fabricated electron gun section and the condenser lens was in a functioning state was employed as the SEM of Comparative Example 1.

Figure 10:
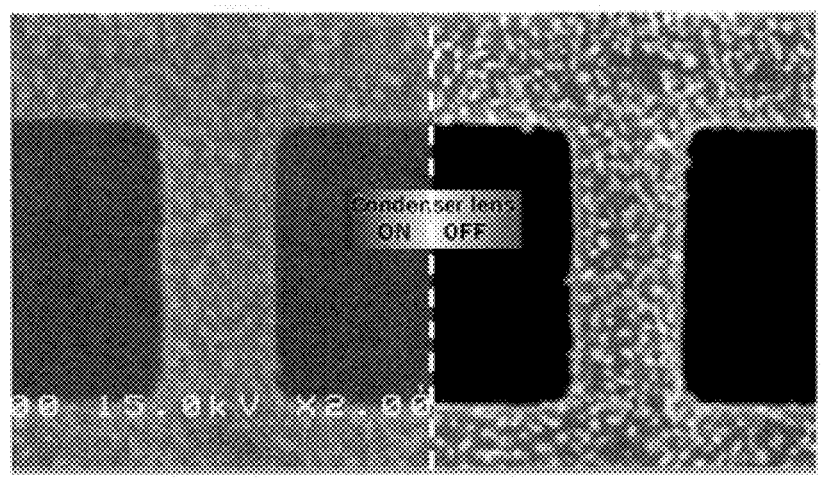
FIG. 10 is a photograph substitute for a drawing, the left side of a dotted line represents an image of a sample captured in Comparative Example 1, and the right side represents an image captured in Example 1.

Next, the SEMs fabricated in Example 1 and Comparative Example 1 were used to capture an image of a sample under the same condition. The left side of a dotted line in FIG. 10 represents an image of a sample captured in Comparative Example 1, and the right side represents an image of a sample captured in Example 1. As is clear from FIG. 10, it was confirmed that the SEM fabricated in Example 1 is superior in resolution to the SEM fabricated in Comparative Example 1. The conventional SEM was equipped with an electron gun by which an emitted electron beam diverges. Thus, it was considered that the combination of a condenser lens and an aperture was essential for obtaining good-quality electron beam. It was however confirmed that, if an electron gun having a photocathode is used as an electron beam source of an electron beam applicator, the combination of a condenser lens and an aperture serves as an obstructive factor in obtaining a high resolution.

INDUSTRIAL APPLICABILITY

With the use of the electron beam applicator and the electron beam emission method in the electron beam applicator disclosed in the present application, it is possible to simplify the control and reduce the size of the device, and it is further possible to control a light source. Therefore, the electron beam applicator and the electron beam emission method disclosed in the present application are useful for business entities that handle an electron beam applicator.

LIST OF REFERENCES 1, 1A to 1E, 10A to 10Q electron beam applicator
1a electron gun section
1b main body section
1c control unit
2 light source
21 excitation light size control member
3 photocathode
4 anode
5 photocathode housing container
5h electron beam passage hole
5m surface treatment material
6a first power supply
6b second power supply
7 objective lens
71 objective lens drive source
8 intermediate electrode
81 electron beam passage hole
82 electron beam input port
83 electron beam exit port
84 drift space
B electron beam
CB vacuum chamber
D detector
EF electric field
EL equipotential line
ELV normal direction force to EL
F focal point
L excitation light
S sample
SC scanning coil

What is claimed is:

1. An electron beam applicator comprising:
an electron gun section;
a main body section; and
a control unit,
wherein the electron gun section includes
a light source,
a photocathode that emits an electron beam in response to receiving excitation light emitted from the light source, wherein the photocathode excludes a round tip for emitting electrons, and
an anode,
wherein the main body section includes
an objective lens that converges an electron beam emitted from the electron gun section, in absence of a condenser lens and an aperture, and
wherein the control unit controls at least convergence power of the objective lens in accordance with a size of an electron beam emitted from the photocathode.

2. The electron beam applicator according to claim 1, wherein the control unit controls intensity of excitation light emitted from the light source.

3. The electron beam applicator according to claim 2 further comprising an excitation light size control member that controls a size of excitation light emitted from the light source to the photocathode,
wherein the excitation light size control member is arranged between the light source and the photocathode.

4. The electron beam applicator according to claim 2,
wherein the objective lens is an electrostatic lens, and
wherein the control unit controls a value of a voltage applied to the electrostatic lens.

5. The electron beam applicator according to claim 2,
wherein the electron beam emitted from the photocathode has no focal point between the photocathode and the objective lens.

6. The electron beam applicator according to claim 1 further comprising an excitation light size control member that controls a size of excitation light emitted from the light source to the photocathode,
wherein the excitation light size control member is arranged between the light source and the photocathode.

7. The electron beam applicator according to claim 6,
wherein the objective lens is an electrostatic lens, and
wherein the control unit controls a value of a voltage applied to the electrostatic lens.

8. The electron beam applicator according to claim 1,
wherein the objective lens is an electrostatic lens, and
wherein the control unit controls a value of a voltage applied to the electrostatic lens.

9. The electron beam applicator according to claim 1,
wherein an intermediate electrode is arranged between the photocathode and the anode, and
wherein
the intermediate electrode has an electron beam passage hole through which an electron beam emitted from the photocathode passes, and
when an electric field is formed between the photocathode and the anode by application of a voltage, a drift space where influence of the electric field is ignorable is formed in the electron beam passage hole.

10. The electron beam applicator according to claim 9, wherein the electron beam emitted from the photocathode has a focal point between the photocathode and the objective lens.

11. The electron beam applicator according to claim 1, wherein the electron beam emitted from the photocathode has no focal point between the photocathode and the objective lens.

12. The electron beam applicator according to claim 1, wherein the electron beam applicator is
an electron microscope.

13. The electron beam applicator according to claim 1, wherein the electron beam applicator is an electron beam drawing device.

14. The electron beam applicator according to claim 1, wherein the electron beam applicator is an electron beam processing device.

15. The electron beam applicator according to claim 1, wherein the electron beam applicator is an electron beam inspection device.

16. The electron beam applicator according to claim 1, wherein the electron beam applicator is an electron diffractometer.

17. An electron beam emission method in an electron beam applicator,
wherein the electron beam applicator includes an electron gun section, a main body section, and a control unit,
wherein the electron gun section includes
a light source,
a photocathode that emits an electron beam in response to receiving excitation light emitted from the light source, wherein the photocathode excludes a round tip for emitting electrons, and
an anode,
wherein the main body section includes
an objective lens that converges an electron beam emitted from the electron gun section, in absence of a condenser lens and an aperture;
the emission method comprising:
an electron beam emission step of emitting an electron beam from the photocathode in response to receiving excitation light emitted from a light source;
an electron beam traveling step of causing an electron beam emitted by the electron beam emission step to travel toward the objective lens arranged in the main body section; and
an electron beam convergence step of converging the electron beam, which reached the main body section by the electron beam traveling step, by using the objective lens, in the absence of the condenser lens and the aperture, and
wherein in the electron beam traveling step, the electron beam emitted from the photocathode travels without having a focal point until reaching the objective lens,
wherein in the electron beam convergence step, the control unit controls convergence power of the objective lens for controlling a degree of convergence of the electron beam.

18. The emission method according to claim 17 further comprising, before the electron beam emission step, an excitation light intensity control step of, at the control unit, controlling intensity of the excitation light emitted from the light source.

19. The emission method according to claim 17,
wherein an excitation light size control member that controls a size of excitation light emitted from the light source to the photocathode is arranged between the light source and the photocathode, and
wherein before the electron beam emission step, the control unit performs an electron beam size control step of using the excitation light size control member to control a size of an electron beam emitted from the photocathode.

20. An electron beam emission method in an electron beam applicator,
wherein the electron beam applicator includes an electron gun section, a main body section, and a control unit,
wherein the electron gun section includes
a light source,
a photocathode that emits an electron beam in response to receiving excitation light emitted from the light source, wherein the photocathode excludes a round tip for emitting electrons,
an anode, and
an intermediate electrode that is arranged between the photocathode and the anode,
wherein the main body section includes
an objective lens that converges an electron beam emitted from the electron gun section, in absence of a condenser lens and an aperture;
the emission method comprising:
an electron beam emission step of emitting an electron beam from the photocathode in response to receiving excitation light emitted from a light source;
an electron beam traveling step of causing an electron beam emitted by the electron beam emission step to travel toward the objective lens arranged in the main body section; and
an electron beam convergence step of converging the electron beam, which reached the main body section by the electron beam traveling step, by using the objective lens, in the absence of the condenser lens and the aperture,
wherein in the electron beam traveling step, the control unit controls the intermediate electrode so that the electron beam emitted from the photocathode
travels so as to have no focal point between the photocathode and the objective lens, or
travels so as to have a focal point between the photocathode and the objective lens,
wherein in the electron beam convergence step, the control unit controls convergence power of the objective lens for controlling a degree of convergence of the electron beam.

* * * * *